United States Patent [19]

Potard

[11] Patent Number: 4,620,587

[45] Date of Patent: * Nov. 4, 1986

[54] PROCESS FOR THE TREATMENT OF A LIQUID MASS

[75] Inventor: Claude Potard, Saint Egreve, France

[73] Assignee: Commissariat a l'Energie Atomique, Paris, France

[*] Notice: The portion of the term of this patent subsequent to Oct. 15, 2002 has been disclaimed.

[21] Appl. No.: 761,855

[22] Filed: Aug. 2, 1985

Related U.S. Application Data

[62] Division of Ser. No. 396,358, Jul. 8, 1982, Pat. No. 4,546,811.

[30] Foreign Application Priority Data

Jul. 17, 1981 [FR] France ................................ 81 13966

[51] Int. Cl.⁴ ............................................ B22D 11/00
[52] U.S. Cl. ..................................... 164/475; 164/485
[58] Field of Search ...................... 164/66.1, 259, 415, 164/475, 455, 125, 443, 485

[56] References Cited

U.S. PATENT DOCUMENTS 3,908,735 9/1975 DiCandia ........................... 164/475

FOREIGN PATENT DOCUMENTS 0343516 12/1977 U.S.S.R. ............................. 164/415

Primary Examiner—Nicholas P. Godici
Assistant Examiner—Richard K. Seidel

[57] ABSTRACT

A process for treatment of a liquid mass is described, wherein a liquid mass of a material is separated from a gas-permeable wall for shaping, positioning or moulding the same by means of a gaseous film formed by a gas permeating through a wall of the container.

3 Claims, 12 Drawing Figures

PROCESS FOR THE TREATMENT OF A LIQUID MASS

This is a divisional of Ser. No. 396,358 filed 7/8/82 now U.S. Pat. No. 4,546,811.

BACKGROUND OF THE INVENTION

The present invention relates to a process for the treatment of a liquid mass enabling the latter to be raised, positioned and moulded without contact with the walls of a container and in particular permitting the shaping of materials by solidification.

Processes involving shaping by moulding lead to considerable problems when the liquids are corrosive, as in the case with high temperature metal alloys. The main problems caused are those of physical physicochemical compatibilities between the material forming the container and the liquid. Reactions can take place between the two materials, which is prejudicial to the purity of the product obtained, whilst there can be incompatible dimensional variations during solidification and as a function of the relative values of the thermal expansion coefficients.

This had led to the use of new methods serving to eliminate the containers through the action of electromagnetic, electrostatic, acoustic and even optical lifting forces. However, these methods are difficult to use and can only be applied to small masses under the earth's gravity. Moreover, they do not permit the shaping of liquid masses.

BRIEF SUMMARY OF THE INVENTION

The present invention relates to a process obviating the aforementioned disadvantages by permitting the lifting and handling of possibly large liquid masses without contact with the walls of a container.

The present invention therefore specifically relates to a process for the treatment of a liquid mass in an apparatus having at least one wall, wherein the liquid mass is raised, positioned or moulded without any contact with the wall as a result of a gaseous film flowing through the said wall, the gas being chemically inert with respect to the liquid mass and the material from which the wall is made.

According to another feature of the present process, the wall is porous or is perforated by narrow ducts in order to permit the passage of the gas used for raising and handling purposes. When the wall is porous, it can be made from a fritted material.

Thus, through preventing any mechanical contact between the liquid and its container, there are no interactions between the liquid and the material from which the walls are made and as a result large liquid masses can be kept in a container. Obviously the gas used for the handling operations must be chemically inert with respect to the liquid and in numerous applications a neutral gas such as helium can be suitable.

Advantageously the container walls are porous and the gaseous film is produced by a forced overflow thereof through the container walls from the outside towards the surface of the liquid. In this way a normal uniform dynamic pressure is established at all points of the surface and this balances the pressure forces exerted by the liquid. The stability of the gaseous film, which is an essential condition for maintaining insulation between the liquid and the wall, is obtained by checking the outflow of the gaseous flux in order to prevent oscillations of the liquid surfaces.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
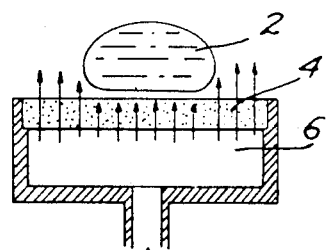
FIG. 1 a diagrammatic sectional view of a liquid drop supported by a gaseous film above a horizontal porous wall.

FIG. 1 shows how a liquid silicon drop 2 can be supported above a wall 4 by means of a gaseous film without any contact between drop 2 and the wall 4. Wall 4 is porous and constitutes the diffusing wall of a chamber 6 permitting the pressurization and heating of the gas used. A liquid drop can either be placed in direct contact with the wall and raised by forcing a gaseous mass through the wall or a solid mass can be used, which is raised by a gaseous film and then melted. In the particular case shown in FIG. 1, a parallelepiped approximately 10 g of solid silicon is placed in the centre of a graphite plate 4 with a 32% open porosity, the plate thickness being approximately 3 mm. The solid silicon block is firstly raised by diffusing the helium through the wall 4. The assembly is placed in a resistance oven, which induces no electromagnetic force on the silicon mass, heating is started up and is increased until the silicon melts. The latter is collected in the form of drops, essentially under the action of the high surface tension of the liquid silicon. To maintain drop 2 at the same point on the outer surface of plate 4, the latter is given a slightly concave shape. Thus, as the weight of the drop is balanced by the pressure of the gaseous film if no restoring force maintains it, it aquires a considerable mobility under the effect of minimal, uncontrolled forces. Thus, a slightly concave wall shape is used to prevent an accidental displacement of the drop.

However, in certain cases it may be necessary to displace liquid drops held above a horizontal wall by a gaseous film.

Figure 2:
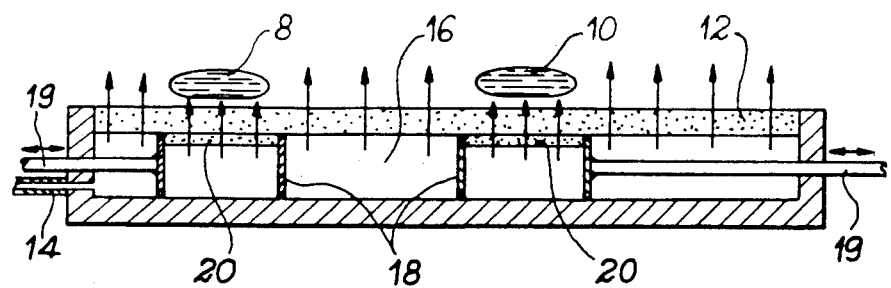
FIG. 2 a similar view to that of FIG. 1 illustrating the displacement of the liquid drops maintained by the gaseous film above a horizontal porous wall.

FIG. 2 illustrates a process permitting such an operation. It is possible to see two drops 8, 10 held above a porous wall 12 by a gaseous film according to the process of the invention. The raising gas arrives through an opening 14 in a chamber 16 and diffuses through wall 12. For the displacement of drops 8 and 10, local overpressures or underpressures are produced and for this purpose slide valves 18 moving within chamber 16 are used. Each of the moving slide valves 18 being controlled by rods 19 has a thin porous plate 20, of the same type as wall 12 and which locally increases the pressure drop of the gases, thus producing pressure reductions on the wall in which the drops 8 and 10 are stabilized. The displacement of the slide valves 18 by means of rods 19 brings about the displacement of the underpressure areas and consequently of the drops.

The processes described hereinbefore with reference to FIGS. 1 and 2 are only applicable to small drops or liquid masses. In the case of larger masses, it is necessary to use containers in which the liquid mass is separated from the walls by a gaseous fillm.

Figure 3:
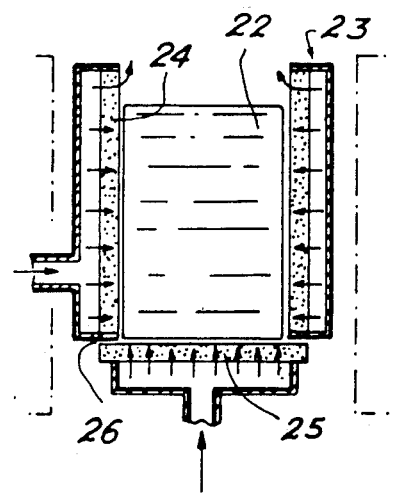
FIG. 3 a diagrammatic sectional view showing a liquid mass contained in a container using the process of the invention.

FIG. 3 illustrates a process for maintaining a liquid mass 22 within a container 23 without any part of the mass being in contact with the walls or bottom of the container. The walls 24 of the latter are porous in order to permit the passage of the gas used for raising and positioning purposes. The base 25 of container 23 is also formed by a porous wall through which is supplied the gas used for raising purposes. It is pointed out that in this case the gas films between the bottom of the container and the liquid mass on the one hand and between the container walls and the liquid mass on the other do not fulfil the same function. The pressure of the gaseous film between the bottom 25 and the liquid 22 only serves to compensate the weight of the latter, whereas the gaseous film between the liquid and container walls 24 is used for compensating the variable hydrostatic pressure of the liquid column. Moreover, bottom 25 of container 23 is not in contact with walls 24. Thus, an opening 26 is made in the lower part of the container to permit the flow of diffused gas through the porous walls.

The process according to the invention has numerous, varied applications, particularly for the shaping of materials from a liquid mass. It is particularly useful in zone melting processes. Existing zone melting processes have disadvantages, particularly when the starting member is in the vertical position. This is due to the lack of stability of the liquefied zone, which may collapse under the action of its own weight, when the height of the liquid part is excessive. The process according to the invention obviates these disadvantages by making it possible to maintain in place materials undergoing a zone melting operation, even when the liquefied zone has large dimensions (height and diameter). For this purpose the melted zone is kept within a sleeve having porous walls by means of a gaseous film and no point of the melted mass is in contact with the sleeve walls. Obviously the sleeve cross-section can be of a random type making it possible to obtain varied profiles.

Figure 4:
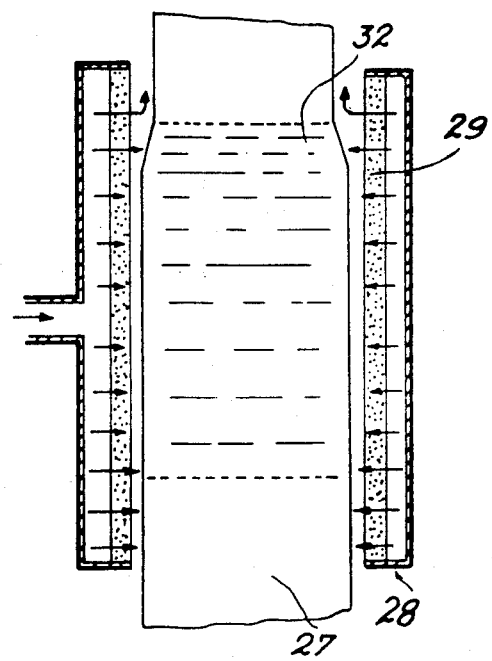
FIG. 4 a diagrammatic sectional view illustrating a vertical zone melting process the melted part of a solid member being contained within a sleeve without contact with the walls thereof.

FIG. 4 illustrates a process for maintaining in a given form a liquid portion of a metal member, e.g. a monocrystalline metal member 27 placed in a vertical zone melting apparatus. Member 27 is placed within a heating sleeve 28 having porous walls 29 in order to permit the passage of a pressurized gas. Sleeve 28 is vertically displaced. The liquefied part 32 of member 27 is maintained without direct contact with the sleeve walls 29 by the gas diffused through the same. During the vertical displacement of sleeve 28, there is a simultaneous displacement of the melted zone 32. Obviously the process is also applicable in the case when the member moves within the sleeve, whilst the latter remains fixed.

Figure 5:
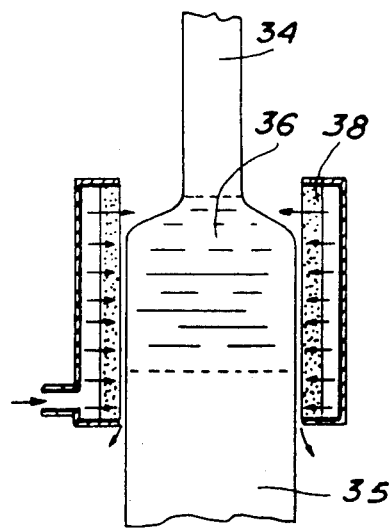
FIG. 5 a vertical drawing or pulling process.

FIG. 5 illustrates a vertical pulling or drawing process, which is also called the CZOCHRALSKI process. In conventional manner, this consists of bringing a very fine tube into contact with the free surface of a melted material. By capillarity the liquid rises along the tube and solidifies, so as to form a nucleus. The tube is then raised very slowly and the liquid adhering to the nucleus solidifies during this displacement. FIG. 5 illustrates such a process, in which the liquid mass is kept out of contact with the walls of the container by the process of the invention. It can be seen that the liquid part 36 of material 35 is maintained by a diffusing, heating sleeve 38, the finished, drawn part is shown at 34.

Figure 6A:
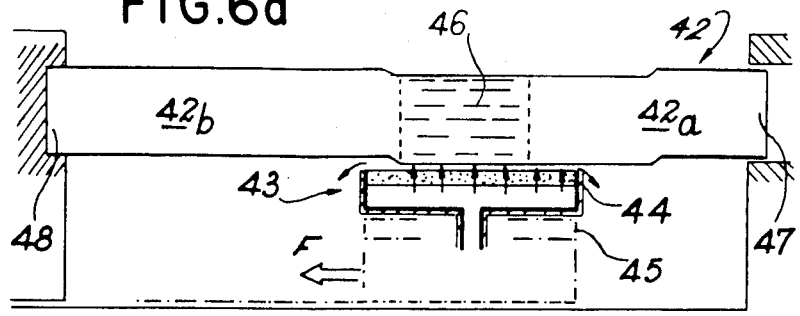
FIGS. 6a and 6b a process for maintaining and shaping a solid material by melting a horizontal area in which a sleeve moves along the solid member, the melted area being separated from the sleeve walls by a gaseous film.
Figure 6B:
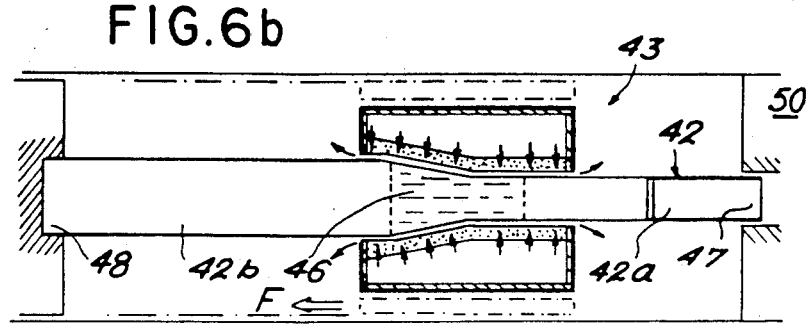
Figure 6C:
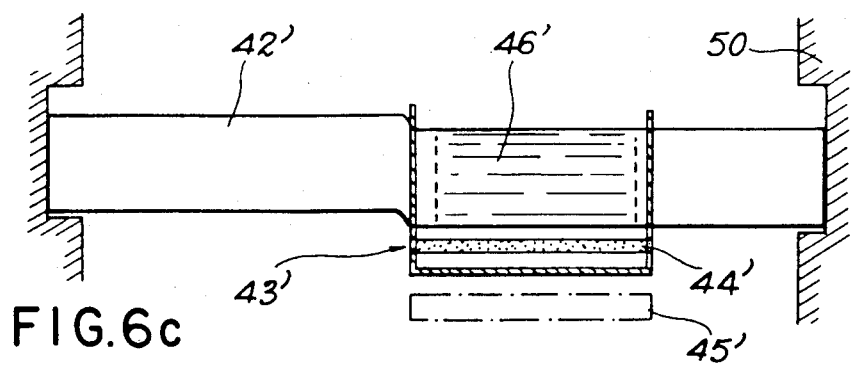
FIG. 6c a horizontal area melting apparatus.

The case of horizontal zone melting with modification of the cross-section is illustrated by FIGS. 6a and 6b showing a solid member 42 held horizontally by its two ends and a sleeve 43 permitting a reduction of the cross-section surrounding member 42 and whose walls 44 are porous. This sleeve can move along member 42 in the direction indicated by arrow F. Heating means 45 make it possible to liquefy that part of member 42 located within it, the liquid mass 46 being held and shaped within the sleeve as a result of a pressurized gaseous film supplied through the effusing walls 44. In the special case described here, FIG. 6a is a side view of the apparatus used in which sleeve 43 is shaped like a cradle, whilst FIG. 6b is a plan view of the same apparatus. It is a question here of reducing the width of member 42 and for this purpose sleeve 43 is given a random shape in order that the liquefied part 46 can bring about the connection between the already finished part 42a and the part of member 42 which is to be narrowed or contracted, i.e. 42b. In the present embodiment member 42 is lengthened and then its width is reduced without modifying its height. For this purpose only the first end 48 of member 42 is fixed, whilst the other end 47 can move progressively within a support 50. FIGS. 6c shows an apparatus for carrying out horizontal zone melting without any variation of the cross-section, in which sleeve 43' has a U-shaped cross-section and supports the liquid zone 46' by means of gas diffused through the porous walls 44'. Obviously sleeve 43' can be broken down into two vertical walls and an independent horizontal base. Heating means 45' melt member 42'. It is clear that in all cases there is no contact between the liquefied part of member 42 and the walls of sleeve 43.

Figure 7:
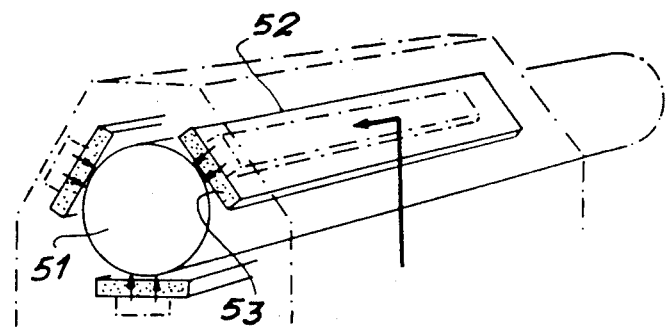
FIG. 7 a diagrammatic view of an elongated liquid mass placed under spatial microgravity and maintained with the aid of porous walls diffusing a gaseous film.

The process of the invention can also be used for the production of materials in spatial microgravity, a field in which the liquids are indeed raised, but their positioning and shaping are not assured. FIG. 7 illustrates such an application in which a liquid mass 51 is kept in an elongted form without contact in microgravity. The positioning of mass 51 is ensured by guide rails 52 having effusing porous walls 53 through which is introduced a gas. As no weight or hydrostatic pressure is exerted, the necessary gaseous flows can be relatively small.

Figure 8:
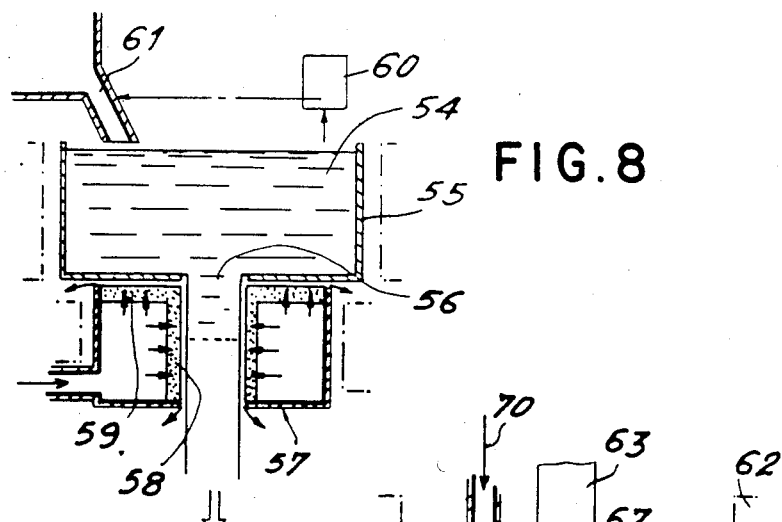
FIG. 8 a diagrammatic sectional view of a continuous casting process in which part of the liquid mass in the container flows in a sleeve, whilst being separated from its walls by a gaseous film.

FIG. 8 illustrates a continuous casting process using the gaseous film raising or lifting process according to the invention. A liquid mass 54 is contained within a container 55, whose base has an opening 56 for the discharge of liquid and its solidification by continuous casting. The liquid flowing through opening 56 passes through a sleeve 57, whose walls 58 are porous in order to permit the passage of a pressurized gas. In the upper part of sleeve 57 there is another horizontal porous wall 59 facing the outer wall of the bottom of container 55 and which is at a very limited distance from the latter. The gaseous film diffused in this way between wall 59 and the container bottom prevents the start of wetting by the liquid flowing through opening 56 of the inner face of the sleeve. A level detector 60 connected to a supply 61 controls the inflow of liquid as a function of the drop of level thereof within container 55. An appropriate setting of the temperature of the gas diffusing through walls 58 makes it possible to position the solid-liquid interface at an appropriate point within sleeve 57. In the case of continuous casting illustrated in FIG. 8, it can be seen that the liquid mass 54 is in contact with the walls of container 55, but is not in contact with the walls of the shaping member or sleeve 57. This is admissible when there is substantially no interaction between the liquid and the walls of container 55 or when it is not wished to produce very high purity material. However, if it is desired to produce a material with a very high purity level, it is possible to use a container 55, whose bottom and walls are porous like those of sleeve 57, in order to permit the passage of a pressurized gas. Thus, the liquid mass is separated from all the walls of the production apparatus by a pressurized gas film.

The process of the invention can also be used in the shaping of material by vertical solidification from the top. This consists of carrying out the forced immersion of a shaping member having an opening provided with an effusing sleeve so as to bring about the rise of the liquid in the sleeve.

Figure 9:
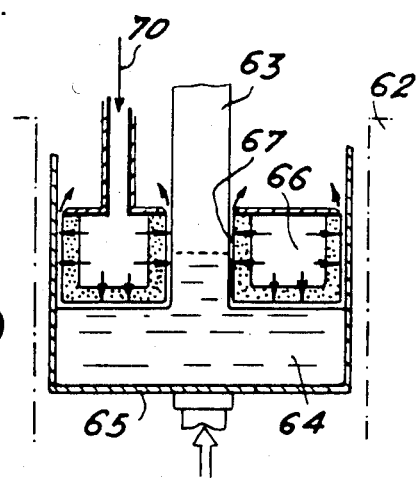
FIG. 9 a diagrammatic sectional view of a process for shaping the solid member by vertical solidification using the process according to the invention.

FIG. 9 illustrates such a process in which a solid member 63 is produced from a liquid mass 64 in a container 65. The latter is placed in an oven 62 in order to keep mass 64 liquid. The maintaining in position of that part of the liquid mass adhering to the solidified portion 63 is brought about by the process of the invention. For this purpose a device 66 called a "shape member" is placed above the free surface of liquid 64. This device has external dimensions which are slightly smaller than those of container 64 and has as its centre an opening defining a passage 67 for producing the solidified portion 63. The walls of the shape member 66 facing the inner wall of container 65, facing the free surface of liquid 64 and in sleeve 67 are porous in order to permit the passage of a gas introduced through opening 70. The gas diffusing through the porous walls of member 66, after partial immersion of the latter in the bath, make it possible to maintain part of the liquid mass within the sleeve 67. The shaped liquid solidifies in sleeve 67. The gas diffusing through the walls facing the free surface of liquid 64 is used for insulation purposes and the gaseous film interposed between the outer walls of member 66 and the inner wall of container 65 prevents the liquid from rising along the latter. As the solid portion 63 is shaped, the level of liquid 64 in container 65 drops. As the shape member 66 has a fixed position, a device is provided for raising the container during production.

Figure 10:
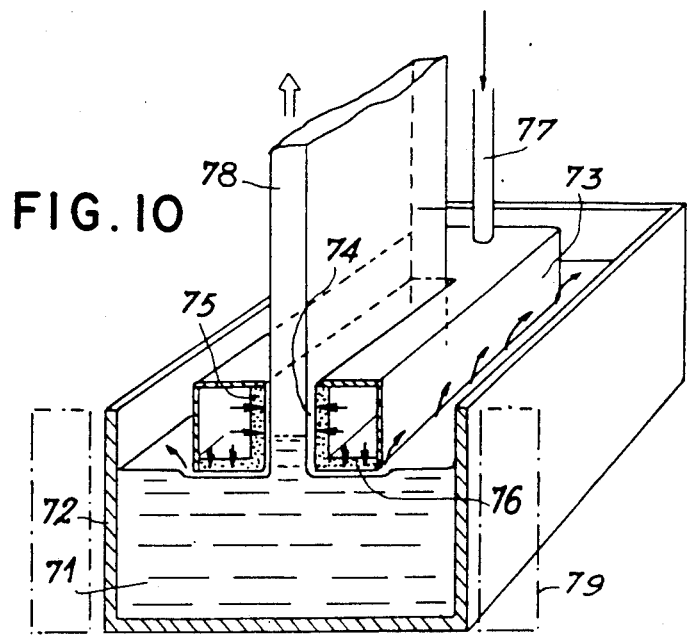
FIG. 10 a process for shaping a photovoltaic silicon plate by vertical pulling using the lifting process according to the invention.

Finally, another interesting application of the process according to the invention is the shaping, by vertical drawing, of photovoltaic silicon plates. FIG. 10 shows an apparatus for applying such a process. It is possible to see a molten silicon mass 71 in a vitreous carbon crucible 72, placed on a height-regulatable support (not shown). Above the free surface of the liquid 71 is arranged a shape member 73 having in its centre a vertical slot defining a sleeve 74 of width 1 mm, height 10 mm and length 50 mm, whose walls 75 are porous. The assembly is placed in an oven 79. Wall 76 of member 73 facing the free surface of liquid 71 is also porous. Gas is supplied into the interior of member 73 by an inlet pipe 77. Initially the lower wall 76 of member 73 is brought into the vicinity of the free surface of liquid 71. The gas is then introduced and the temperature within the slot stabilized at a few degrees below the melting point of the silicon. A 0.5 mm thick, flat nucleus is then introduced into slot 74 until it is in contact with the surface of the liquid. A solid-liquid interface is then formed and its position is then fixed within the slot by an appropriate setting of the heating means of oven 79. Drawing or pulling can then commence at the desired speed. The liquid level drops as plate 78 is formed. As the shape member is fixed with respect to oven 79, bath level variations are compensated by a continuous rise of crucible 72. It is also pointed out that in the applications illustrated in FIGS. 9 and 10, the liquid is in contact with the walls 65 and 72 of the container containing it. On desiring to produce a very high purity material, it is possible to use porous walls and the comments made hereinbefore in connection with continuous casting also apply here.

The process of the invention has numerous advantages, because it permits the shaping of solid materials from a liquid mass without any contact between the latter and the container walls. This prevents any possible interaction and makes it possible to obtain a high purity end product. The process is applicable to various shaping methods, particularly zone melting, continuous casting, solidification by vertical drawing and the production of high purity glass. It can also be used in maintaining and positioning liquid masses in microgravity. It also makes it possible to displace liquid masses above a horizontal wall without contact with the latter.

Finally it is obvious that the invention is not limited to the embodiments described and numerous variants are possible thereto without passing beyond the scope of the invention, particularly with regards to the choice of the lifting gas and the materials used for forming the porous walls for the diffusion thereof.

What is claimed is:

1. A process for producing a solid member from a molten mass by continuous casting comprising the steps of providing a container having a discharge opening in its bottom for receiving said molten mass and a gas-permeable sleeve communicating with said discharge opening and disposed therebelow, said sleeve being open at the bottom thereof and made from a gas-permeable porous fritted material or perforated with narrow ducts, causing a pressurized gas to pass from the outside of said sleeve to the inner walls thereof while causing said molten mass to flow therethrough, whereby a pressurized gaseous film is formed separating said mass from the inner walls of said sleeve while a solid-liquid interface is formed therein, and regulating the temperature of said pressurized gas to control the position of the solid-liquid interface formed within said sleeve.

2. A process according to claim 1, wherein said sleeve is connected to a horizontal porous wall constructed of said porous material and opposed to the bottom of the container and spaced therefrom, and said pressurized gas is passed therethrough and to the bottom of said container, thereby to prevent wetting of the sleeve opening at said container bottom as the liquid mass enters said sleeve.

3. A process according to claim 1, wherein both the bottom and side walls of said container are constructed of said porous material and said pressurized gas is passed therethrough, whereby to form a gaseous film separating all walls of the casting apparatus from said liquid mass.

* * * * *